United States Patent [19]
Fairgrieve

[11] Patent Number: 5,812,026
[45] Date of Patent: Sep. 22, 1998

[54] DIFFERENTIAL AMPLIFIER WITH IMPROVED VOLTAGE GAIN

[75] Inventor: Alexander Fairgrieve, Menlo Park, Calif.

[73] Assignee: Elantec, Inc., Milpitas, Calif.

[21] Appl. No.: 705,596

[22] Filed: Aug. 30, 1996

[51] Int. Cl.[6] ...................................................... H03F 3/45
[52] U.S. Cl. ............................................ 330/252; 330/311
[58] Field of Search ..................................... 330/252, 260, 330/311

[56] References Cited

U.S. PATENT DOCUMENTS

| | | | |
|---|---|---|---|
| 4,626,795 | 12/1986 | Tanaka et al. | 330/257 |
| 5,144,169 | 9/1992 | Hirabayashi et al. | 330/257 X |
| 5,168,243 | 12/1992 | Feliz et al. | 330/252 |

*Primary Examiner*—James B. Mullins
*Attorney, Agent, or Firm*—Fliesler, Dubb, Meyer & Lovejoy

[57] ABSTRACT

A circuit used with a differential amplifier to eliminate the effect of Early Voltage from voltage gain provided by the differential amplifier. With a differential amplifier utilizing PNP transistors which experience the lowest, and most undesirable Early Voltage, the circuitry includes a pair of transistors 400 and 402, each with a base connected to an input of the differential amplifier corresponding to a similar base connection of a respective one of transistors 100 and 102 of the differential amplifier, an emitter connected to a current source, and a collector connected to the collector of a respective one of NPN current sink transistors 306 and 308 connected at outputs of the differential amplifier. The circuitry for elimination of Early Voltage further includes components to assure the collector voltages of transistors 400 and 402 are equal and the collector voltages of transistors 102 and 400 are equal. In addition to circuitry for elimination of Early Voltage when PNP transistors 100 and 102 are used to provide the differential amplifier inputs, the circuitry may also be configured for use when NPN transistors provide inputs for a differential amplifier.

16 Claims, 9 Drawing Sheets

FIG. 8

DIFFERENTIAL AMPLIFIER WITH IMPROVED VOLTAGE GAIN

BACKGROUND OF THE INVENTION

1. Field of the Invention

This invention relates to differential amplifiers. More particularly, this invention relates to differential amplifiers with circuitry to increase output voltage gain.

2. Description of the Related Art

Figure 1:
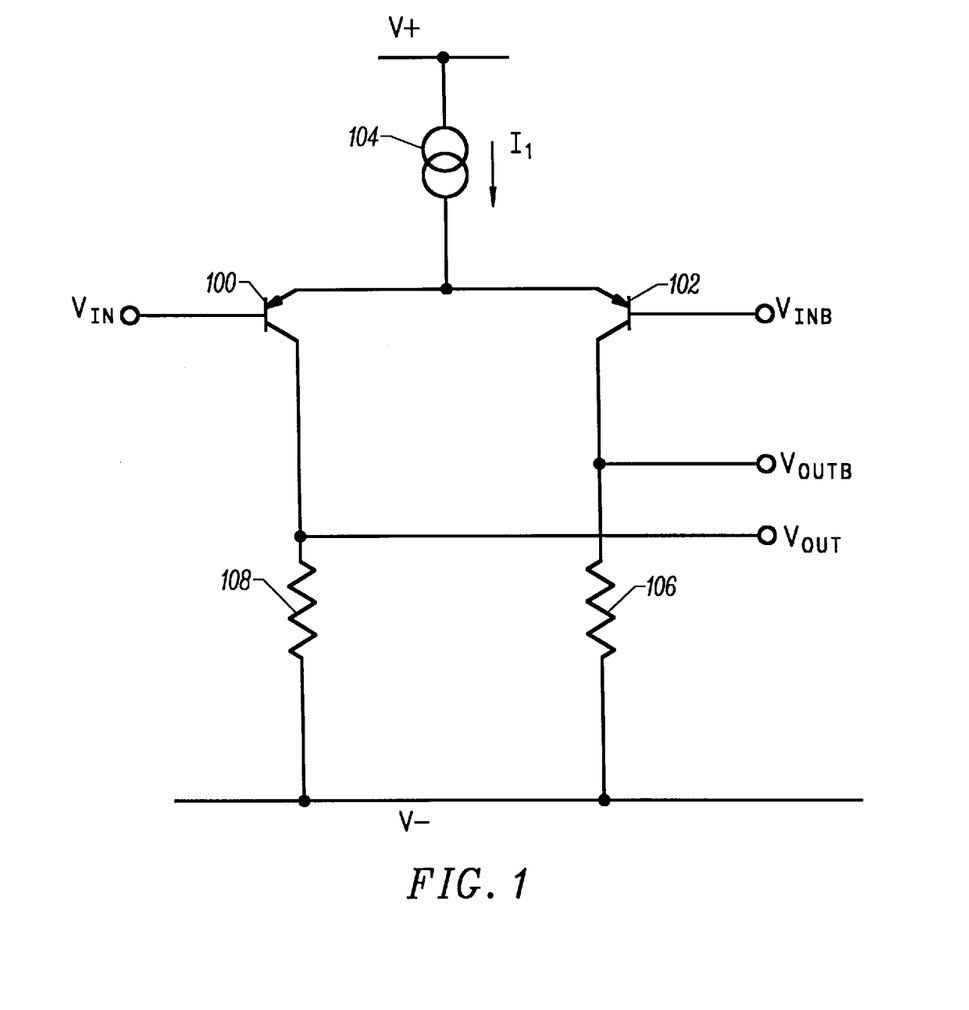
FIG. 1 shows a conventional differential amplifier.

FIG. 1 shows a conventional differential amplifier. The differential amplifier includes PNP transistors 100 and 102 with input voltages $V_{IN}$ and $V_{INB}$ received at their respective bases, outputs $V_{OUT}$ and $V_{OUTB}$ provided at their respective collectors, and emitters connected to a current source 104.

Transistors 100 and 102 are shown as PNP transistors to emphasize the undesirability of Early Voltage, because PNP transistors typically have a much lower Early Voltage than NPN transistors and provide a more dominant limitation on output voltage gain. Transistors 100 and 102 may, however, be NPN transistors, and the Early Voltage will still limit output voltage gain.

With sizes of transistors 100 and 102 being equal and loading at the outputs $V_{OUT}$ and $V_{OUTB}$ being equal, voltage gain of a differential amplifier can be expressed as $V_{GAIN} = g_m R_{Leff}$, where $g_m$ is the transconductance of one the bipolar transistors 100 or 102, and $R_{Leff}$ is the effective load impedance at one of the outputs of the transistor, such as at $V_{OUT}$ or $V_{OUTB}$. In general, $R_{Leff}$ is the parallel combination of the actual load, such as provided by resistors 106 or 108, and the output impedance of one of the transistors of the differential amplifier, such as 100 or 102. The highest gain can be achieved when the actual load impedance is infinite, or at least substantially higher than a transistor output impedance.

Figure 2:
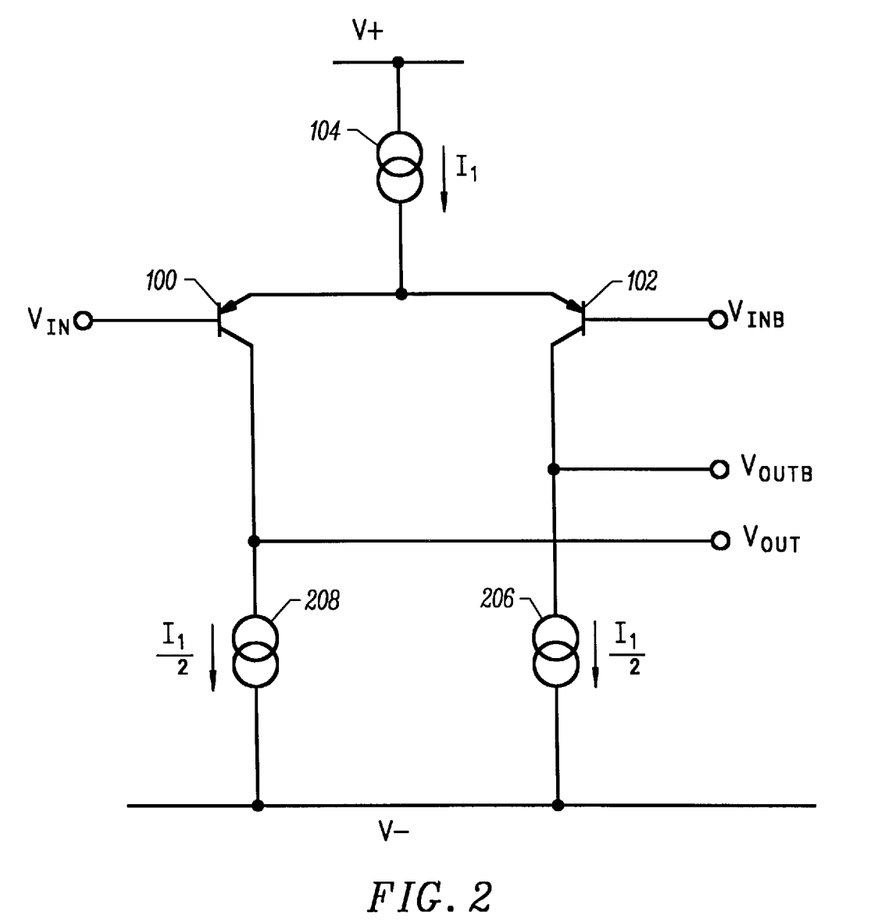
FIG. 2 illustrates ideal current sinks provided to replace load resistors used at the output of the differential amplifier of FIG. 1.

FIG. 2 illustrates that to provide an actual load with a very high impedance, ideal current sinks 206 and 208 may be used in place of load resistors 106 and 108 of FIG. 1. With the actual load impedance of infinity using ideal current sinks 206 and 208, the highest obtainable voltage gain is then limited solely by transistor output impedance. Gain for the circuit of FIG. 2 can, thus, be simplified to $V_{gain} = V_{EARLY}/V_t$, where Vt is KT/q=T/11,600, with T being temperature in Kelvin and $V_{EARLY}$ being the forward Early Voltage of one of the transistors of the differential amplifier such as transistor 100 or transistor 102. Note that components carried over from FIG. 1 to FIG. 2 are similarly labeled, as will be components carried over in subsequent drawings.

Figure 3:
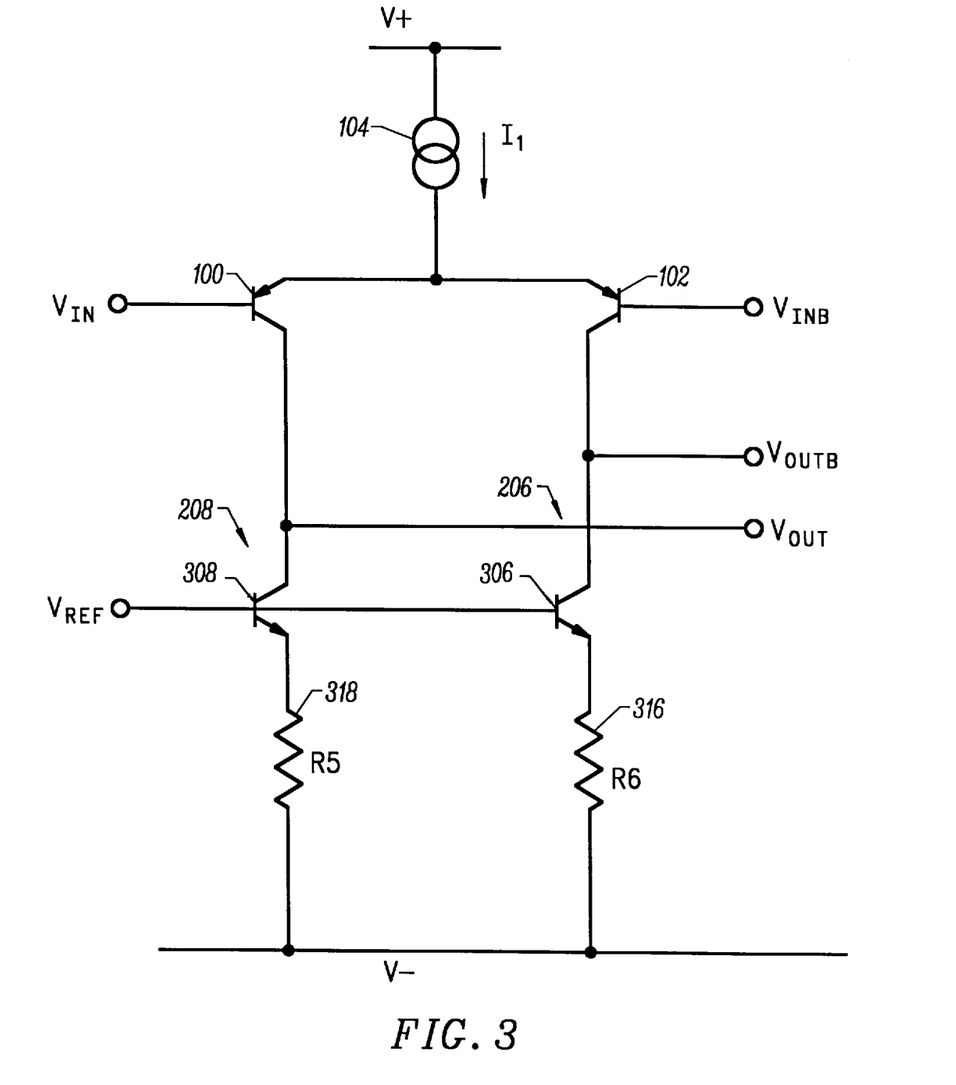
FIG. 3 shows conventional circuitry for the current sinks 206 and 208 of FIG. 2.

FIG. 3 illustrates circuitry conventionally used for providing current sinks 206 and 208 of FIG. 2, but with a finite yet very high effective output impedance. As shown, current sink 206 is provided by an NPN transistor 306 having a collector connected to the collector of transistor 102, and an emitter connected through a resistor 316 to a lower power supply rail (V−). Current sink 208 is provided by an NPN transistor 308 having a collector connected to the collector of transistor 100, and an emitter connected through a resistor 318 to V−.

Bases of transistors 306 and 308 are provided by a voltage reference $V_{REF}$. Use of degeneration, or negative feedback provided by resistors 316 and 318 on the emitters of the NPN current sink transistors 306 and 308 ensures an NPN output impedance vastly greater than the output impedance of one of PNP transistors 101 or 102.

For maximizing gain, the Early Voltage of the PNP transistors needs to be as high as possible. To achieve a higher frequency response, in general transistor basewidths are made thinner. One undesirable effect of having a thinner transistor basewidth is that the forward Early Voltage becomes lower.

SUMMARY OF THE INVENTION

The present invention includes circuitry to eliminate the effect of Early Voltage from the voltage gain of a differential amplifier.

Figure 4:
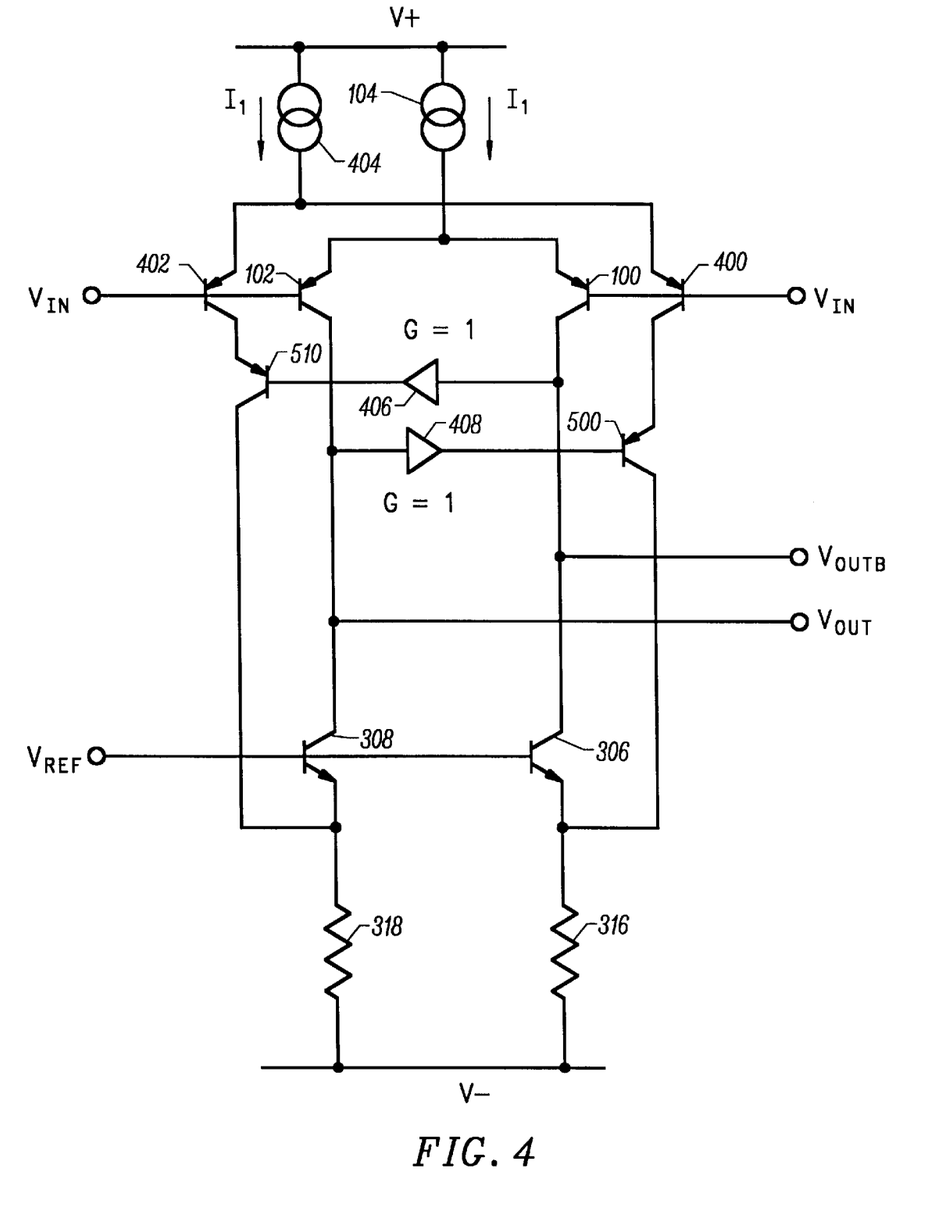
FIG. 4 shows the differential amplifier of FIG. 3 along with circuitry of the present invention utilized to eliminate the effect of Early Voltage.

With a differential amplifier utilizing PNP transistors, referring to FIG. 4, the present invention includes a pair of transistors 400 and 402, each with a base connected to a respective input of the differential amplifier in correspondence with bases of respective transistors 100 and 102 of the differential amplifier, an emitter connected to a current source 404, and a collector coupled to the collector of the respective one of the NPN current sink transistors 306 and 308. The present invention further includes circuitry to assure the collector voltages of transistors 100 and 402 are substantially equal and the collector voltages of transistors 102 and 400 are substantially equal. Further, transistor sizes of transistors 100, 102, 400 and 402 are made substantially identical. Also, in one embodiment of the present invention, the current source 404 is configured to supply the same current as current source 104.

To provide higher gain than when current sources 104 and 404 are configured to provide the same current, in another embodiment of the present invention current supplied by current source 404 is controlled to be slightly greater than current supplied by current source 104. The additional current is provided to overcome alpha losses in transistors coupling the emitters of transistors 400 or 402 to the current sink transistors 306 and 308, as well as alpha losses in the current sink transistors 306 and 308.

Although one embodiment of the present invention utilizes a single current source 404, to increase input impedance, an additional embodiment of the present invention utilizes two current sources to replace the single current source 404, each of the two current sources supplying one half of the current supplied by current source 104, each of the two current sources being connected to one of transistors 400 and 402.

In yet another embodiment of the present invention, in addition to compensating for the Early Voltage effect, compensation is provided for impedance loading across the outputs $V_{OUT}$ and $V_{OUTB}$ by providing an identical impedance across the collectors of transistors 400 and 402. The compensating impedance can include both real and imaginary components to cancel out the effect of parasitic capacitance.

Although the present invention is summarized above for use with a differential amplifier having PNP transistors providing the amplifier inputs, transistor types may be changed to enable the present invention to be used with a differential amplifier having NPN transistors providing the amplifier inputs. Further, although summarized above for use with a differential amplifier provided with a differential output, the present invention can be utilized with a differential amplifier providing a single ended output.

BRIEF DESCRIPTION OF THE DRAWINGS

Further details of the present invention are explained with the help of the attached drawings in which.

DETAILED DESCRIPTION

FIG. 4 shows the differential amplifier of FIG. 3 along with circuitry of the present invention utilized to eliminate the effect of Early Voltage. As shown, circuitry for compensation of Early Voltage includes transistors 400 and 402, a current source 404, transistors 500 and 510 and buffers 406 and 408. The current source 404 is connected to the emitters of transistors 400 and 402. The bases of the transistors 400 and 402 are connected to the respective inputs $V_{IN}$ and $V_{INB}$ of the differential amplifier, while collectors of transistors 400 and 402 are connected to the respective outputs $V_{OUT}$ and $V_{OUTB}$. PNP transistor 510 has an emitter connected to the collector of transistor 402, and a collector connected to the emitter of transistor 308. The buffer 406 has an input connected to the collector of transistor 100 and an output connected to the base of transistor 510. PNP transistor 500 has an emitter connected to the collector of transistor 400, and a collector connected to the emitter of transistor 306. The buffer 408 has an input connected to the collector of transistor 102 and an output connected to the base of transistor 500. The gain of buffers 406 and 408 are each set at 1 to assure that the voltages at the collectors of transistors 100 and 402 are equal, and that the voltages at the collectors of transistors 102 and 400 are equal. Sizes of transistors 100, 102, 400 and 402 are made substantially identical. Further, current sources 104 and 404 are controlled to supply substantially the same current.

Figure 5:
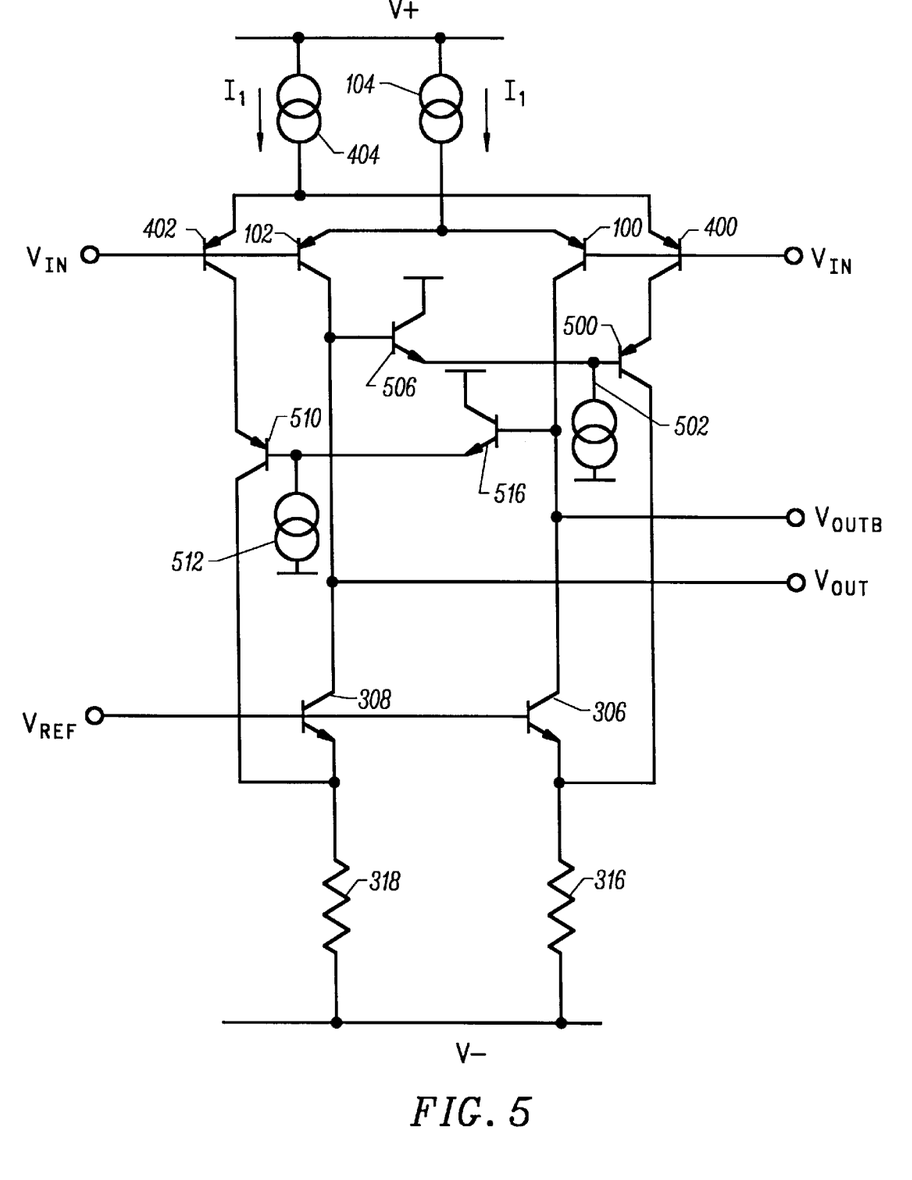
FIG. 5 shows the circuitry of FIG. 4 with specific circuitry to implement the voltage followers in FIG. 4.

FIG. 5 shows the circuitry of FIG. 4 with specific circuitry to implement the buffers 406 and 408. The buffer 408 is implemented with a current sink 502 and NPN transistor 506. The buffer 406 is implemented with a PNP, current sink 512 and NPN transistor 516.

To form the buffer 408, transistor 506 has a base connected to the collector of transistor 102, a collector connected to the upper power supply rail V+ and an emitter connected to current source 502.

To form the buffer 406, transistor 516 has a base connected to the collector of transistor 100, a collector connected to the upper power supply rail V+ and an emitter connected to current source 512.

Figure 5A:
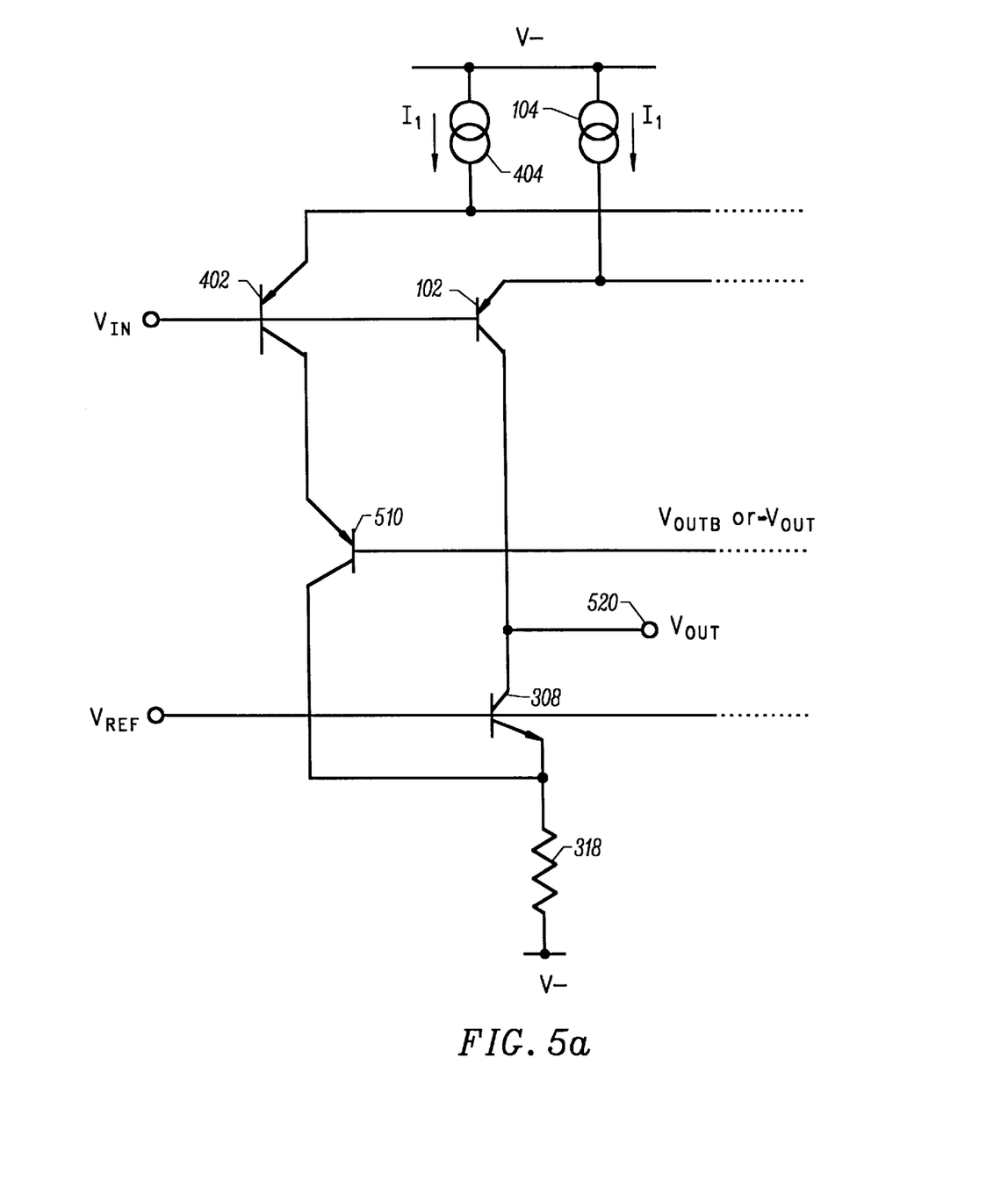
FIG. 5A which shows half the circuit of FIG. 5.

Due to symmetry of the circuit of FIG. 5, operation of the circuit will be described with respect to FIG. 5A which shows half the circuit of FIG. 5. To describe operation, the output impedance of the PNP transistors is first defined as $R_{OP}$, while the output impedance of the NPN transistors is defined as $R_{ON}$. Further, the collector/emitter current ratio for the NPN transistors is defined as $\alpha_N$, while the collector/emitter current ratio for the PNP transistors is defined as $\alpha_P$.

With the above definitions, we now assume that a small change in voltage occurs at $V_{OUT}$, defined as $\delta VOUT$. Change in collector currents of transistors 102, 402 and 510, the collector currents being defined respectively as $Ic_{102}$, $Ic_{402}$ and $Ic_{510}$, can be derived as follows:

$$\delta Ic_{102} = \delta V_{OUT}/R_{OP}$$

$$\delta Ic_{402} = \delta V_{OUT}/R_{OP}$$

$$\delta Ic_{510} = (-\delta V_{OUT}/R_{OP})\alpha_P$$

By Kirchoff's law, the current $Ic_{308}$ at the collector of the NPN transistor 308 includes the current $Ic_{510}$ reduced by $\alpha_N$ due to current provided to the base of transistor 308. Thus, the change in collector current of transistor 308 is derived as follows:

$$\begin{aligned}\delta Ic_{308} &= (\delta V_{OUT}/R_{ON}) + (\alpha_N \delta Ic_{510}) \\ &= (\delta V_{OUT}/R_{ON}) + (\alpha_N \alpha_P(-\delta V_{OUT}/R_{OP}))\end{aligned}$$

Thus, the total change in current at the node 520 supplying $V_{OUT}$ is derived as follows:

$$\begin{aligned}\delta Ic_{520} &= \delta Ic_{308} + \delta Ic_{102} \\ &= (\delta V_{OUT}/R_{ON}) - (\alpha_N \alpha_P(\delta V_{OUT}/R_{OP})) + (\delta V_{OUT}/R_{OP})\end{aligned}$$

With $\alpha_P \alpha_N$ approximately equal to 1, the net change in current at the node 520, $Ic_{520}=(\delta V_{OUT}/R_{ON})$. The impedance at the output node 520 will, thus, be $R_{ON}$.

Thus, use of the circuitry of the present invention prevents $R_{OP}$ of the PNP transistors from affecting impedance at the gain node 520. Gain is limited only by the output impedance of the current sink transistors, such as transistors 308 and 318. With the circuit of the present invention gain improvement can be as high as 10 to 100 times.

To provide even higher gain, instead of configuring current sources 104 and 404 to supply the same current, current supplied by current source 404 can be controlled to be slightly greater than current supplied by current source 104. The additional current is provided to overcome losses due to $\alpha_N$ and $\alpha_P$ in transistors 306, 308, 500 and 510. In the equations derived above, $\alpha_N$ and $\alpha_P$ are both assumed to be 1, but in reality are slightly less. By compensating for the amount that $\alpha_N$ and $\alpha_P$ are less than 1 by supplying slightly more current from current source 404 and current source 104, gain will be closer to gain assumed with ideal components.

Figure 6:
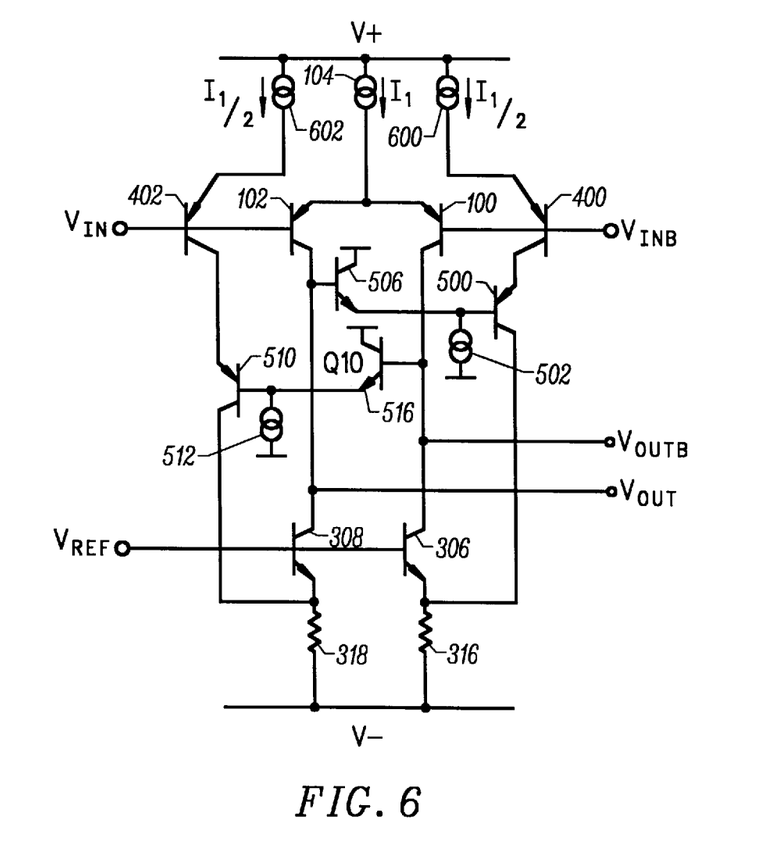
FIG. 6 shows the circuit of FIG. 5 modified to include two current sources to replace the single current source used in the circuit of the present invention to compensate for Early Voltage.

FIG. 6 shows the circuit of FIG. 5 modified to include two current sources 600 and 602 to replace the single current source 404 used in previous drawings. The current sources 600 and 602 are each configured to supply half of the current supplied by current source 104. Use of two current sources 600 and 602, as shown, instead of a single current source 404 as shown previously, enables input impedance at inputs $V_{IN}$ and $V_{INB}$ to be increased.

Figure 7:
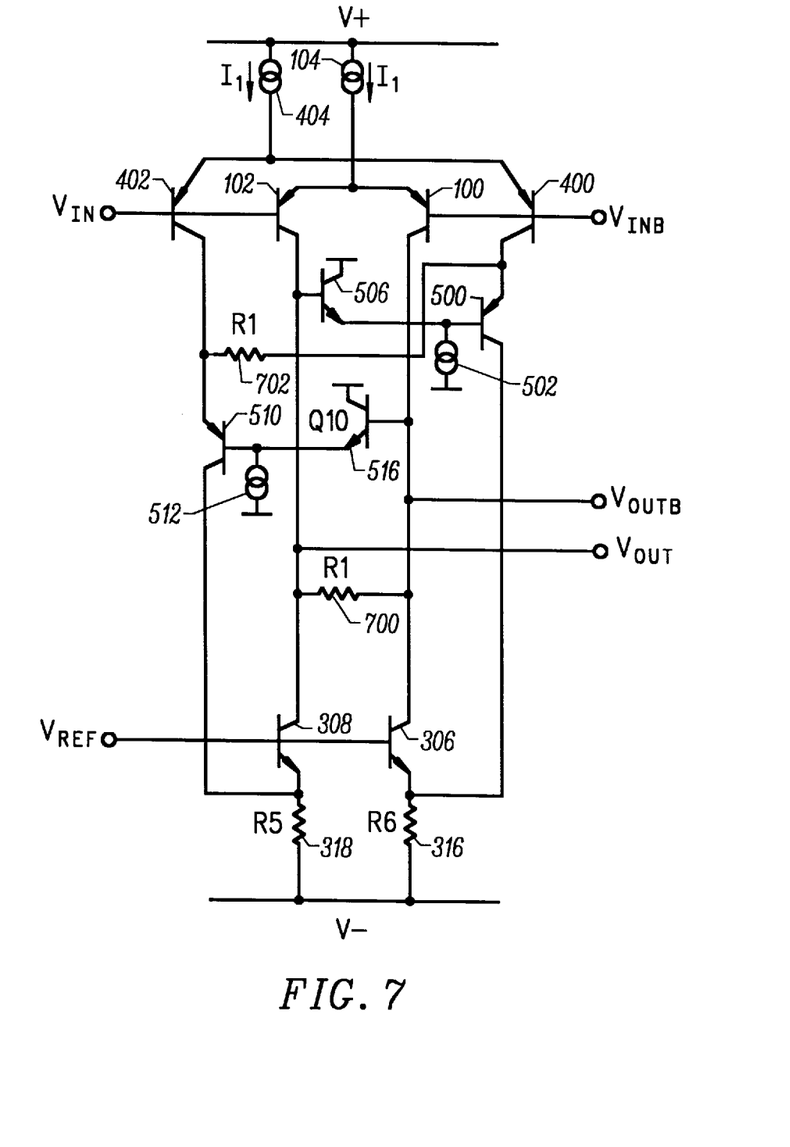
FIG. 7 shows the circuit of FIG. 5 with loading of the outputs $V_{OUT}$ and $V_{OUTB}$ provided other than by current sinks, and compensation for such loading.

FIG. 7 shows the circuit of FIG. 5 with loading of the outputs $V_{OUT}$ and $V_{OUTB}$ provided other than by current sinks, and compensation for such loading. In FIG. 7, a resistor 700 is added across the outputs $V_{OUT}$ and $V_{OUTB}$ having a resistance value $R_1$, and a resistor 702 is connected across the collectors of transistors 400 and 402 having an equal resistance value $R_1$ to compensate for resistor 700. With the circuit configured as shown, load currents due to resistors 700 and 702 will be cancelled, maintaining the impedance of node $V_{OUT}$ as $R_{ON}$.

The resistor 700 may not necessarily a discrete component, but instead may take into account loading at the outputs $V_{OUT}$ and $V_{OUTB}$ that is not possible to remove. Although loading is shown as resistor 700, loading can be an impedance with both real and imaginary components. An equal impedance may likewise be used in place of resistor 702 to compensate for both real and imaginary components of loading. With compensation for imaginary components of loading, parasitic capacitance on the outputs can be cancelled out, allowing a designer to define dominant poles by use of controlled components and eliminating the need to include the effects of unwanted parasitic capacitance in a design.

Figure 8:
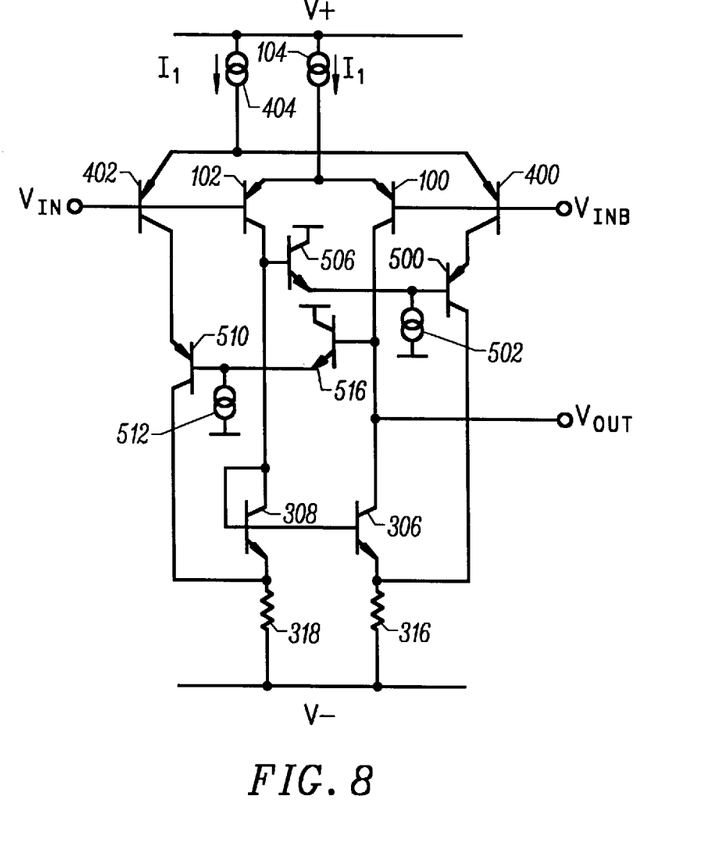
FIG. 8 shows the present invention utilized with a differential amplifier having a single ended output, as opposed to a differential output.

Although the present invention is described above for use with a differential amplifier provided with a differential output $V_{OUT}$ and $V_{OUTB}$, the present invention can be utilized with a differential amplifier providing a single ended output $V_{OUT}$ as shown in FIG. 8. As with circuitry described above with respect to a differential output, circuitry of the present invention utilized with a single ended output will provide the same advantages of high voltage gain and load cancellation.

Further, although the present invention as described above for use with a differential amplifier having PNP transistors 100 and 102 providing the amplifier inputs, transistor types may be changed to enable the present invention to be used with a differential amplifier having NPN transistors providing the amplifier inputs.

Although the invention has been described above with particularity, this was merely to teach one of ordinary skill in the art how to make and use the invention. Many modifications will fall within the scope of the invention, as that scope is defined by the claims which follow.

What is claimed is:

1. A differential amplifier comprising:
   a first current source;
   a first pair of transistors, each transistor in the first pair having a base coupled to an input of the differential amplifier, and an emitter to collector path having a first end connected to the first current source, and a second end, the second end of the emitter to collector path of at least one of the first pair being coupled to an output of the differential amplifier;
   a first current sink coupled to the second ends of the emitter to collector paths of the first pair of transistors; and
   a circuit providing a replica of an output impedance of the transistors in the first pair connected to substantially eliminate a voltage at the output of the differential amplifier due to the output impedance of the transistors in the first pair.

2. The differential amplifier of claim 1, wherein the first current sink comprises:
   a second pair of transistors, each transistor in the second pair having an emitter to collector path with a first end connected to a second end of the emitter to collector path of a respective one of the first pair of transistors, and
   wherein the circuit providing a replica comprises:
   a second current source means;
   a third pair of transistors, each transistor in the third pair having an emitter to collector path connected on a first end to the second current source means, a first transistor in the third pair having a base connected to a base of a first transistor in the first pair and a second end of its emitter to collector path coupled to a second end of the emitter to collector path of a first transistor in the second pair, and a second transistor in the third pair having a base connected to a base of a second transistor in the first pair and a second end of its emitter to collector path coupled to a second end of the emitter to collector path of a second transistor in the second pair;
   a first buffer having an input connected to the second end of a collector to emitter path of the first transistor of the first pair;
   a first buffer connected transistor having a collector to emitter path coupling the collector to emitter path of the second transistor in the third pair to the collector to emitter path of the second transistor in the second pair, and having a base connected to an output of the first buffer;
   a second buffer having an input connected to the second end of a collector to emitter path of the second transistor of the first pair; and
   a second buffer connected transistor having a collector to emitter path coupling the collector to emitter path of the first transistor in the third pair to the collector to emitter path of a first transistor in the second pair, and having a base connected to an output of the second buffer.

3. The differential amplifier of claim 2,
   wherein the first buffer comprises:
   a second current sink connected to the base of the first buffer connected transistor; and
   a first buffer transistor having a base connected to the second end of the collector to emitter path of the first transistor of the first pair, and an emitter to collector path connecting a power supply (V+) to the second current sink, and
   wherein the second buffer comprises:
   a third current sink connected to the base of the second buffer connected transistor; and
   a second buffer transistor having a base connected to the second end of the collector to emitter path of the second transistor of the first pair, and an emitter to collector path connecting the power supply (V+) to the third current sink.

4. The differential amplifier of claim 2, wherein the second current source means comprises a single current source supplying substantially the same current as the first current source.

5. The differential amplifier of claim 2, wherein the second current source means comprises:
   a second current source coupled to the first end of the emitter to collector path of the first transistor of the third pair, the second current source supplying substantially one half of the current of the first current source; and
   a third current source coupled to the first end of the emitter to collector path of the second transistor of the third pair, the third current source supplying substantially one half of the current of the first current source.

6. The differential amplifier of claim 2, wherein the second current source means supplies a slightly greater current than the first current source to compensate for the extent that alpha is less than one in the second pair of transistors.

7. The differential amplifier of claim 2, wherein sizes of transistors in the first pair of transistors and the third pair of transistors are substantially equal.

8. The differential amplifier of claim 2, wherein the transistors in the first pair of transistors and the third pair of transistors are PNP transistors.

9. The differential amplifier of claim 2, wherein the transistors in the first pair of transistors and the third pair of transistors are NPN transistors.

10. The differential amplifier of claim 2, further comprising:
- a first load impedance connected between the second ends of the emitter to collector paths of the first pair of transistors; and
- a second load impedance substantially equal to the first load impedance connected between the second ends of the emitter to collector paths of the third pair of transistors to substantially eliminate the effect of the first load impedance from the voltage at the output of the differential amplifier.

11. A differential amplifier comprising:
a first current source;
a first pair of transistors, each transistor in the first pair being a PNP transistor and having a base coupled to an input of the differential amplifier, an emitter connected to the first current source, and a collector coupled to an output of the differential amplifier;
a second pair of transistors, each transistor in the second pair being an NPN transistor, a first transistor in the second pair having a collector connected to a collector of a first transistor in the first pair, an emitter connected through a resistive element to ground and a base connected to a voltage reference, and a second transistor in the second pair having a collector connected to a collector of a second transistor in the first pair, an emitter connected through a resistive element to ground, and a base connected to the voltage reference;
a second current source means;
a third pair of transistors, each transistor in the third pair being a PNP transistor with an emitter connected to the second current source, a first transistor in the third pair having a base connected to a base of a first transistor in the first pair, and a second transistor in the third pair having a base connected to a base of a second transistor in the first pair;
a first buffer having an input connected to the collector of the first transistor of the first pair;
a is PNP buffer connected transistor having an emitter connected to the collector of the second transistor in the third pair, a collector connected to the emitter of the second transistor in the second pair, and a base connected to an output of the first buffer;
a second buffer having an input connected to the collector of the second transistor of the first pair; and
a second PNP buffer connected transistor having an emitter connected to the collector of the first transistor in the third pair, a collector connected to the emitter of the first transistor in the second pair, and a base connected to an output of the second buffer.

12. The differential amplifier of claim 11, wherein the second current source means is a single current source supplying substantially the same current as the first current source.

13. The differential amplifier of claim 12, wherein sizes of transistors in the first pair of transistors and the third pair of transistors are substantially equal.

14. The differential amplifier of claim 11, wherein the second current source means comprises:
- a second current source connected to the emitter of the first transistor of the third pair, the second current source supplying substantially one half of the current of the first current source; and
- a third current source connected to the emitter of the second transistor of the third pair, the third current source supplying substantially one half of the current of the first current source.

15. The differential amplifier of claim 11, further comprising:
- a first load impedance connected between the collectors of the first pair of transistors; and
- a second load impedance substantially equal to the first load impedance connected between the collectors of the third pair of transistors to substantially eliminate the effect of the first load impedance from the voltage at the outputs of the differential amplifier.

16. The differential amplifier of claim 11,
wherein the first buffer comprises:
- a first current sink connected to the base of the first PNP buffer connected transistor; and
- a first NPN buffer transistor having a base connected to the collector of the first transistor of the first pair, a collector connected to a power supply (V+) and an emitter connected to the first current sink; and wherein the second buffer comprises:
- a second current sink connected to the base of the second PNP buffer connected transistor; and
- a second NPN buffer transistor having a base connected to the collector of the second transistor in the first pair, a collector connected to the power supply (V+) and an emitter connected to the second current sink.

* * * * *

UNITED STATES PATENT AND TRADEMARK OFFICE
CERTIFICATE OF CORRECTION

PATENT NO. : 5,812,026
DATED : September 22, 1998
INVENTOR(S) : Fairgrieve

It is certified that error appears in the above-identified patent and that said Letters Patent is hereby corrected as shown below:

Column 7, line 46, after "a" and before PNP, delete "is" and substitute therefor --first--

Signed and Sealed this

Fifteenth Day of May, 2001

Attest:

NICHOLAS P. GODICI

Attesting Officer    Acting Director of the United States Patent and Trademark Office